United States Patent
Hwang

(10) Patent No.: US 8,339,492 B2
(45) Date of Patent: Dec. 25, 2012

(54) IMAGE SENSOR INHIBITING ELECTRICAL SHORTS IN A CONTRACT PLUG PENETRATING AN IMAGE SENSING DEVICE AND METHOD FOR MANUFACTURING THE SAME

(75) Inventor: Joon Hwang, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 541 days.

(21) Appl. No.: 12/566,802

(22) Filed: Sep. 25, 2009

(65) Prior Publication Data

US 2010/0079639 A1   Apr. 1, 2010

(30) Foreign Application Priority Data

Sep. 30, 2008  (KR) .................. 10-2008-0096087

(51) Int. Cl.
- *H04N 3/14* (2006.01)
- *H04N 5/335* (2011.01)
- *H01L 31/062* (2012.01)
- *H01L 31/113* (2006.01)
- *H01L 27/148* (2006.01)
- *H01L 29/04* (2006.01)
- *H01L 29/10* (2006.01)
- *H01L 31/00* (2006.01)

(52) U.S. Cl. ........ 348/294; 348/302; 348/311; 257/291; 257/53; 257/233

(58) Field of Classification Search .................. 348/294, 348/311, 302; 257/291, 292, 233, 53
See application file for complete search history.

(56) References Cited

U.S. PATENT DOCUMENTS

| | | | | |
|---|---|---|---|---|
| 6,252,218 | B1* | 6/2001 | Chou | 250/208.1 |
| 7,067,895 | B1* | 6/2006 | Razouk | 257/461 |
| 2004/0041932 | A1* | 3/2004 | Chao et al. | 348/308 |
| 2004/0262635 | A1* | 12/2004 | Lee | 257/199 |
| 2005/0035381 | A1* | 2/2005 | Holm et al. | 257/290 |
| 2005/0040316 | A1* | 2/2005 | Holm et al. | 250/208.1 |
| 2005/0282356 | A1* | 12/2005 | Lee | 438/458 |
| 2006/0275962 | A1* | 12/2006 | Lee | 438/152 |
| 2007/0002156 | A1* | 1/2007 | Hagood et al. | 348/296 |
| 2007/0102740 | A1* | 5/2007 | Ellis-Monaghan et al. | 257/292 |
| 2008/0067621 | A1* | 3/2008 | Chang et al. | 257/444 |
| 2008/0079102 | A1* | 4/2008 | Chen et al. | 257/431 |

(Continued)

FOREIGN PATENT DOCUMENTS

KR   10-2005-0117674 A   12/2005

(Continued)

*Primary Examiner* — Aung S Moe
*Assistant Examiner* — Chia-Wei A Chen
(74) *Attorney, Agent, or Firm* — Saliwanchik, Lloyd & Eisenschenk

(57) ABSTRACT

An image sensor and a method for manufacturing the same are provided. An image sensor comprises a readout circuitry, an interlayer dielectric, an interconnection, an image sensing device, and a contact. The readout circuitry is formed at a first substrate. The interlayer dielectric is formed on the first substrate. The interconnection is formed in the interlayer dielectric. The interconnection is electrically connected to the readout circuitry. The image sensing device is formed on the interconnection. The image sensing device comprises a first conductive type layer and a second conductive type layer. The contact connects the first conductive type layer of the image sensing device and the interconnection electrically. The contact is isolated from the second conductive type layer by a trench formed in the second conductive layer around the contact.

19 Claims, 5 Drawing Sheets

U.S. PATENT DOCUMENTS

| | | | |
|---|---|---|---|
| 2008/0143859 A1* | 6/2008 | Wells | 348/294 |
| 2008/0203556 A1* | 8/2008 | Huang | 257/698 |
| 2008/0224136 A1* | 9/2008 | Wang et al. | 257/53 |
| 2008/0265360 A1* | 10/2008 | Lee | 257/499 |
| 2008/0277754 A1* | 11/2008 | Liu | 257/443 |
| 2009/0090903 A1* | 4/2009 | Kim et al. | 257/40 |
| 2009/0302375 A1* | 12/2009 | Sonsky et al. | 257/329 |
| 2009/0303366 A1* | 12/2009 | Gambino et al. | 348/308 |
| 2010/0078759 A1* | 4/2010 | Sekar et al. | 257/530 |
| 2010/0120193 A1* | 5/2010 | Miida | 438/94 |

FOREIGN PATENT DOCUMENTS

| | | |
|---|---|---|
| KR | 10-2006-0120260 A | 11/2006 |
| KR | 10-2010-0012641 A | 2/2010 |

* cited by examiner

IMAGE SENSOR INHIBITING ELECTRICAL SHORTS IN A CONTRACT PLUG PENETRATING AN IMAGE SENSING DEVICE AND METHOD FOR MANUFACTURING THE SAME

CROSS-REFERENCE TO RELATED APPLICATION

This application claims the benefit under 35 U.S.C. §119 of Korean Patent Application No. 10-2008-0096087, filed Sep. 30, 2008, which is hereby incorporated by reference in its entirety.

BACKGROUND

The present disclosure relates to an image sensor and a method for manufacturing the same.

An image sensor is a semiconductor device for converting an optical image into an electric signal. The image sensor may be roughly classified into a charge coupled device (CCD) image sensor and a complementary metal oxide semiconductor (CMOS) image sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality.

Also, since a stack height does not reduce as much as the reduction in the area of the light receiving portion, the number of photons incident to the light receiving portion is also reduced due to diffraction of light called Airy disk.

As an alternative to overcome this limitation, an attempt of forming a photodiode using amorphous silicon (Si), or forming a readout circuitry in a silicon (Si) substrate using a method such as wafer-to-wafer bonding, and forming a photodiode on and/or over the readout circuitry has been made (referred to as a "three-dimensional (3D) image sensor). The photodiode is connected with the readout circuitry through a metal interconnection.

In the related-art, there is a limitation in that electrical short occurs in the photodiode by a contact plug that connects the readout circuitry and the photodiode.

In addition, because both the source and the drain of the transfer transistor are heavily doped with N-type impurities, a charge sharing phenomenon occurs. When the charge sharing phenomenon occurs, the sensitivity of an output image is reduced and an image error may be generated. Also, because a photo charge does not readily move between the photodiode and the readout circuitry, a dark current is generated and/or saturation and sensitivity is reduced.

BRIEF SUMMARY

Embodiments provide an image sensor that can inhibit electrical shorts in a contact plug connecting a readout circuitry and an image sensing device, and a method for manufacturing the same.

Embodiments also provide an image sensor where a charge sharing does not occur while increasing a fill factor and a method for manufacturing the same.

Embodiments also provide an image sensor that can minimize a dark current source and inhibit saturation reduction and sensitivity degradation by forming a smooth transfer path of a photo charge between a photodiode and a readout circuit, and a method for manufacturing the same.

In one embodiment, an image sensor comprises: a readout circuitry at a first substrate; an interlayer dielectric on the first substrate; an interconnection in the interlayer dielectric, the interconnection being electrically connected to the readout circuitry; an image sensing device on the interconnection, the image sensing device comprising a first conductive type layer and a second conductive type layer; and a contact electrically connecting the first conductive type layer of the image sensing device and the interconnection. The contact is electrically isolated from the second conductive type layer by removing a portion of the second conductive type layer around the contact.

In another embodiment, A method for manufacturing an image sensor comprises: forming a readout circuitry at a first substrate; forming an interlayer dielectric on the first substrate, and forming an interconnection electrically connected to the readout circuitry in the interlayer dielectric; forming an image sensing device comprising a first conductive type layer and a second conductive type layer on the interconnection; forming a contact connecting the first conductive type layer of the image sensing device to the interconnection; and removing a portion of the second conductive type layer that contacts the contact.

The details of one or more embodiments are set forth in the accompanying drawings and the description below. Other features will be apparent from the description and drawings, and from the claims.

DETAILED DESCRIPTION

Hereinafter, embodiments of an image sensor and a method for manufacturing the same will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
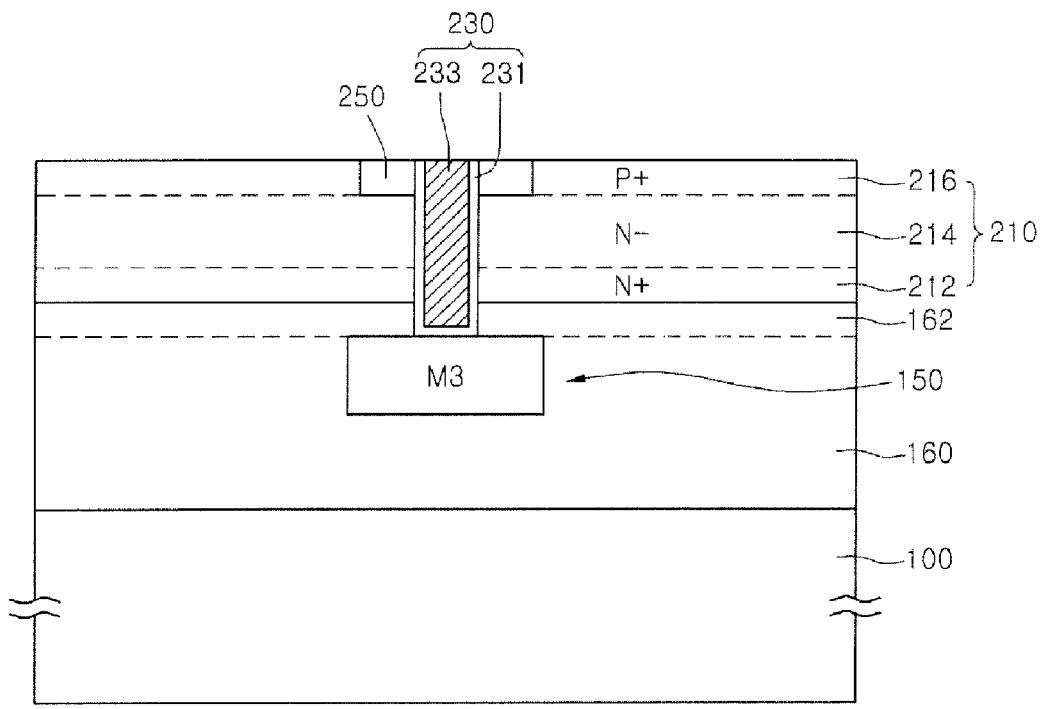
FIG. 1 is a cross-sectional view of an image sensor according to a first embodiment.

FIG. 1 is a cross-sectional view of an image sensor according to a first embodiment.

Referring to FIG. 1, an image sensor according to the first embodiment includes: a readout circuitry 120 formed in a first substrate 100 (see FIG. 3); an interlayer dielectric 160 disposed over the first substrate 100; an interconnection 150 electrically connected to the readout circuitry 120, the interconnection 150 being disposed over the interlayer dielectric 160; an image sensing device 210 including a first conductive type layer 214 and a second conductive type layer 216, the image sensing device 210 being disposed over the interconnection 150; and a contact 230 electrically connecting the first conductive type layer 214 of the image sensing device 210 and the interconnection 150.

The image sensing device 210 may be a photodiode, but, without being limited thereto, may be a photogate, or a combination of the photodiode and the photogate. Embodiments include a photodiode formed in a crystalline semiconductor layer as an example. However, embodiments are not limited thereto, and may include, for example, a photodiode formed in amorphous semiconductor layer.

Unexplained reference numerals in FIG. 1 will be described with reference to the drawings illustrating a method for manufacturing the image sensor below.

Hereinafter, a method for manufacturing the image sensor according to the first embodiment will be described with reference to FIGS. 2 to 13.

Figure 2:
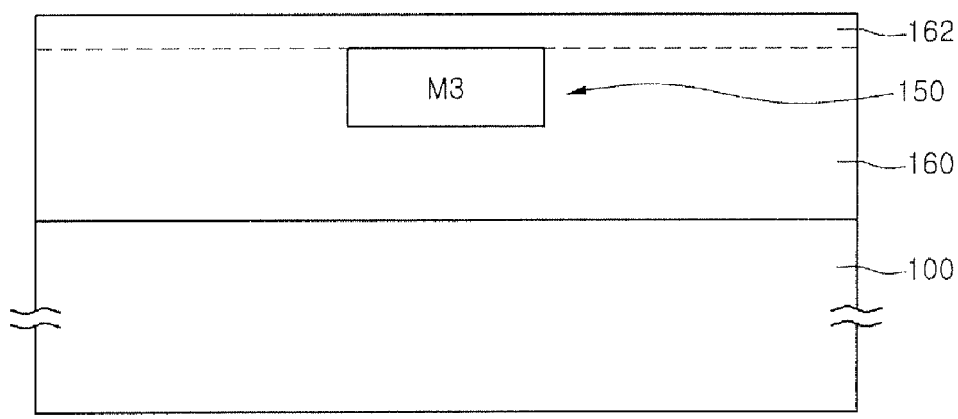
FIGS. 2 to 9 are cross-sectional views illustrating a method for manufacturing the image sensor according to a first embodiment.
Figure 3:
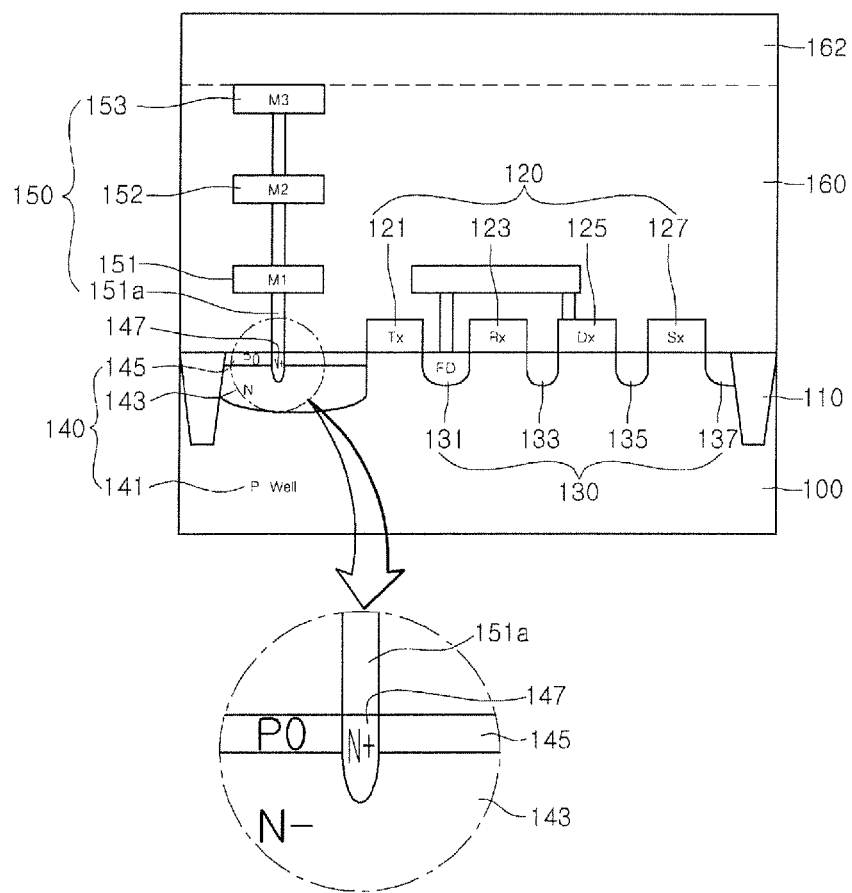

FIG. 2 is a cross-sectional view illustrating a first substrate 100 where an interconnection 150 is formed, and FIG. 3 is a detail view of the first substrate of FIG. 2. Hereinafter, detailed descriptions will be made with reference to FIG. 3.

As illustrated in FIG. 3, an active region is defined by forming a device isolation layer 110 in the first substrate 100. The readout circuitry 120 may include a transfer transistor (Tx) 121, a reset transistor (Rx) 123, a drive transistor (Dx) 125, and a select transistor (Sx) 127. An ion implantation region 130 including a floating diffusion region (FD) 131 and a source/drain region 133, 135 and 137 for each transistor may be formed.

According to an embodiment, an electrical junction region 140 can be formed on the first substrate 100 and a first conductive connection 147 can be formed electrically connected to the interconnection 150 at an upper part of the electrical junction region 140.

For example, the electrical junction region 140 may be a P-N junction 140, but is not limited thereto. For example, the electrical junction region 140 may include a first conductive type ion implantation layer 143 formed on a second conductive type well 141 or second conductive type epitaxial layer, and a second conductive type ion implantation layer 145 formed on the first conductive type ion implantation layer 143. For example, as shown in FIG. 2, the P-N junction 140 may be a P0(145)/N−(143)/P−(141) junction, but embodiments are not limited thereto. The first substrate 100 may be a second conductive type substrate, but is not limited thereto.

According to an embodiment, the device is designed to provide a potential difference between the source and drain of the transfer transistor (Tx), thereby enabling the full dumping of a photo charge. Accordingly, a photo charge generated in the photodiode is dumped to the floating diffusion region, thereby increasing the output image sensitivity.

Specifically, electrons generated in the photodiode 210 are transferred to the PNP junction 140, and they are transferred to the floating diffusion (FD) 131 node to be converted into a voltage when the transfer transistor (Tx) 121 is turned on.

The maximum voltage of the P0/N−/P− junction 140 becomes a pinning voltage, and the maximum voltage of the FD 131 node becomes Vdd minus the threshold voltage (Vth) of the reset transistor (Rx). Therefore, due to a potential difference between the source and drain of the Tx 121, without charge sharing, electrons generated in the photodiode 210 on the chip can be completely dumped to the FD 131 node.

Thus, unlike the related art case of connecting a photodiode simply to an N+ junction, an embodiment of the present invention makes it possible to inhibit saturation reduction and sensitivity degradation.

A first conductive connection 147 can be formed between the photodiode and the readout circuit to create a smooth transfer path of a photo charge, thereby making it possible to minimize a dark current source and inhibit saturation reduction and sensitivity degradation.

To this end, the first embodiment may form an N+ doping region as a first conductive connection 147 for an ohmic contact on the surface of the P0/N−/P− junction 140. The N+ region (147) may be formed such that it pierces the P0 region (145) to contact the N− region (143).

The width of the first conductive connection 147 may be minimized to inhibit the first conductive connection 147 from being a leakage source. To this end, a plug implant may be performed after etching a contact hole for a first metal contact 151a, but embodiments are not limited thereto. As another example, an ion implantation pattern (not shown) may be formed, and the ion implantation pattern may be used as an ion implantation mask to form the first conductive connection 147.

Next, a first interlayer dielectric 160 may be formed on the first substrate 100, and an interconnection 150 may be formed. The interconnection 150 may include the first metal contact 151a, a first metal 151, a second metal 152, and a third metal 153, but embodiments are not limited thereto.

A second interlayer dielectric 162 is formed on the interconnection 150. For example, the second interlayer dielectric 162 may be formed of a dielectric such as an oxide layer or a nitride layer. The second interlayer dielectric 162 increases bonding force of a second substrate (not shown) provided with the image sensing device 210 and the first substrate 100.

Figure 4:
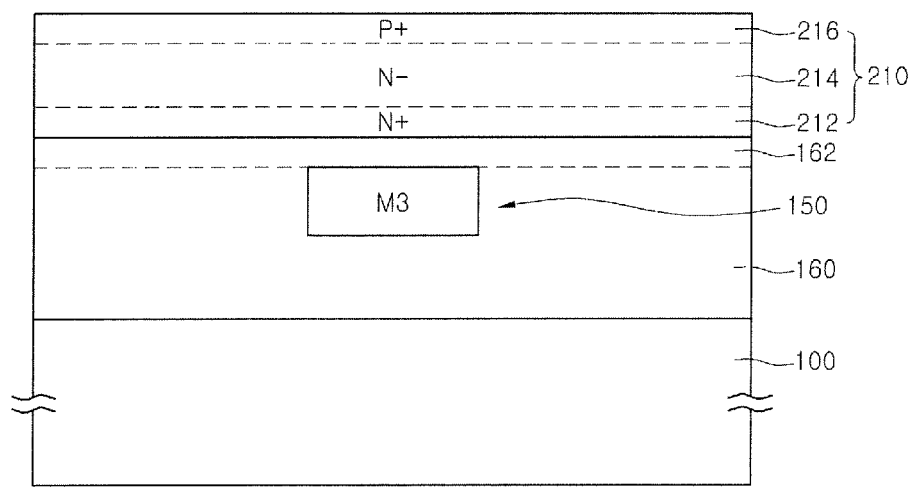

Referring to FIG. 4, the image sensing device 210 including the first conductive type layer 214 and the second conductive type layer 216 is formed on the second interlayer dielectric 162. The first substrate upon which the image sensing device 210 is formed is illustrated in FIG. 2.

According to an embodiment, a crystalline semiconductor layer of a second substrate may be provided with the photodiode including the N− layer (214) and the P+ layer (216). An N+ layer of a first conductive type layer 212 for an ohmic contact may be further provided. The second substrate can be bonded to the first substrate and the photodiode disposed on the first substrate.

Thereafter, an inter-pixel separation layer (not shown) may be formed to separate the image sensing device 210 into pixels. For example, the inter-pixel separation layer may be formed using an inter-pixel separation dielectric or an inter-pixel separation ion implantation layer. The inter-pixel separation layer may be formed after the contact 230 is formed.

Figure 5:
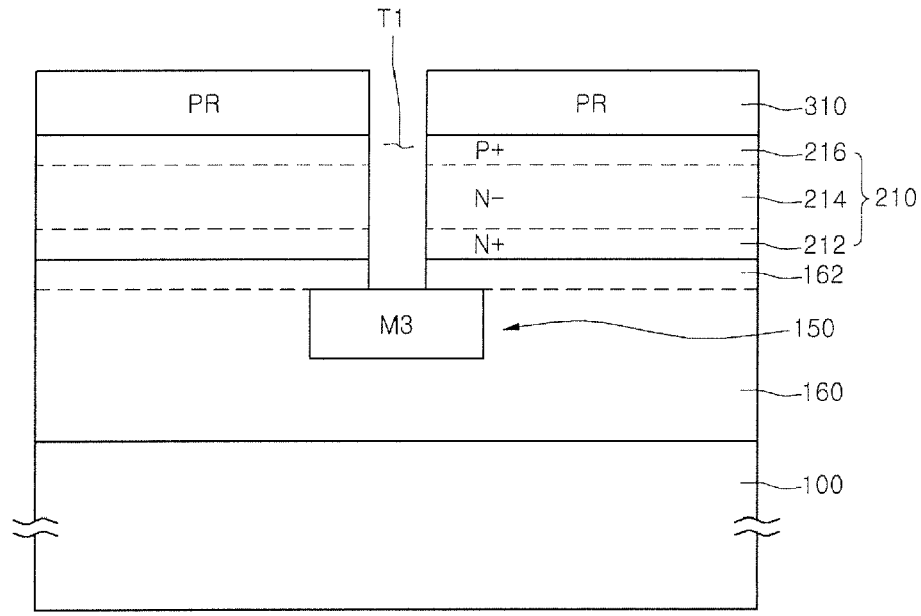

Next, referring to FIG. 5, a first trench T1 exposing the interconnection 150 may be formed by partially removing the image sensing device 210. For example, the upper part of the interconnection 150 may be exposed by partially removing the image sensing device 210 and the second interlayer dielectric 162 using a first photoresist pattern 310 as an etch mask. The etching for forming the first trench T1 may be performed through a dry etch or a wet etch. A secondary etching may be performed to etch the image sensing device 210 and the second interlayer dielectric 162, respectively.

Figure 6:
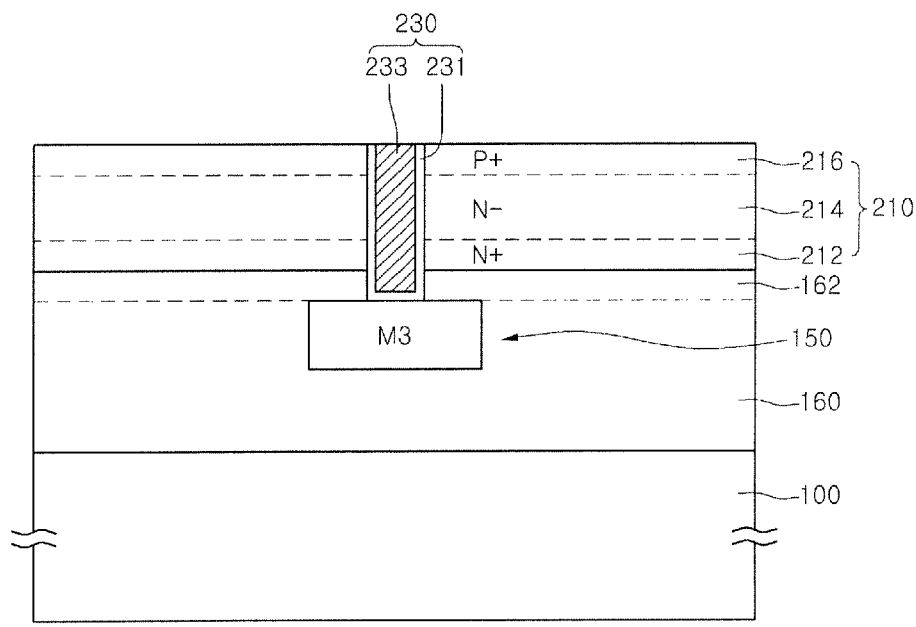

Next, referring to FIG. 6, the first photoresist pattern 310 may be removed, and a contact 230 may be formed to fill the first trench T1. For example, after a barrier metal layer 231 is formed on the surface of the first trench T1, a contact plug 233 may be formed on the barrier metal layer 231 to fill the first trench T1. The barrier metal layer 231 may be a mono- or bi-layer formed of Ti or TiN, and the contact plug 233 may be formed of tungsten (W), but embodiments are not limited thereto.

Figure 7:
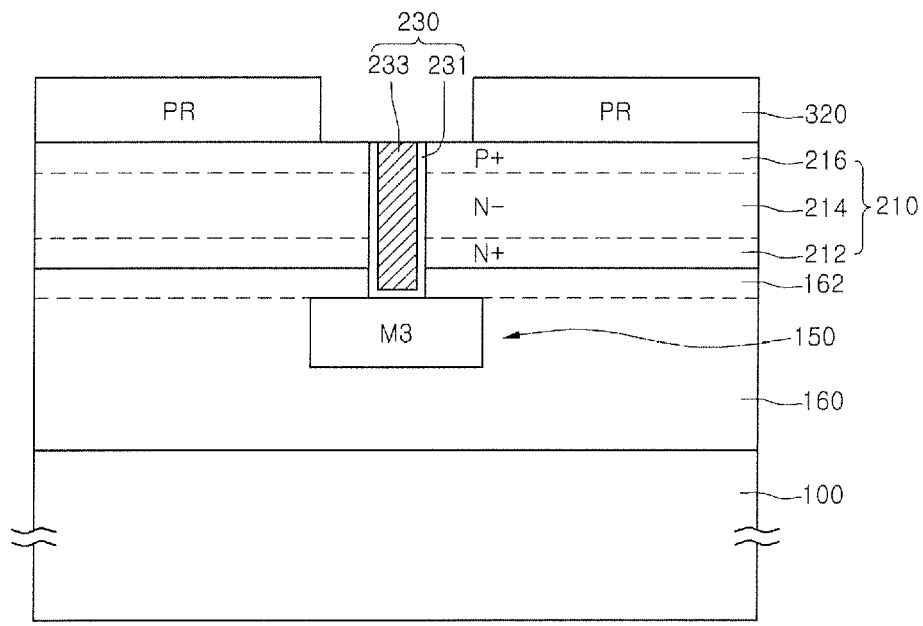

Next, referring to FIG. 7, a second photoresist pattern 320 may be formed on the image sensing device 210 to remove a portion of the second conductive type layer 216 of the image sensing device 210 contacting the contact 230. In this case, a region exposed by the second photoresist pattern 320 may be formed wider than the width of the contact 230, exposing a portion of the second conductive type layer 216 adjacent to the contract region 230.

Figure 8:
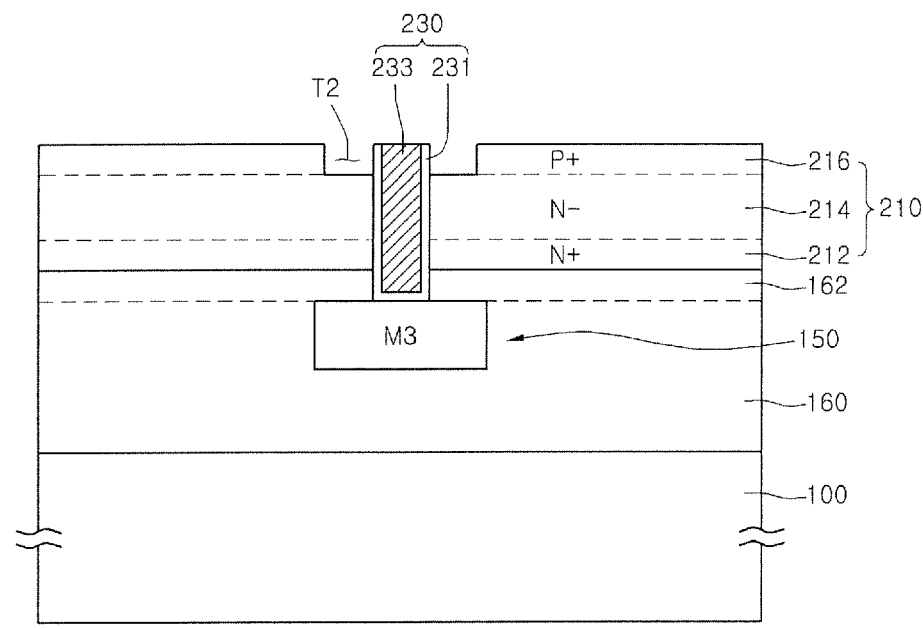

Next, referring to FIG. 8, a portion of the second conductive type layer 216 of the image sensing device 210 contacting the contact 230 may be removed using the second photoresist pattern 320 as an etch mask. In this case, the second conductive type layer 216 contacting the contact 230 may be removed through a wet etching using etching selectivity with respect to the contact 230.

As the second conductive type layer 216 of the image sensing device 210 contacting the contact 230 is removed, the second trench T2 may be formed to expose portions of the first conductive type layer 214 and the contact 230. Thereafter, the second photoresist pattern 320 is removed.

The method for manufacturing an image sensor according to the embodiment can inhibit electrical shorts in a contact plug connecting a readout circuitry and an image sensing device by removing a second conductor type layer contacting the contact plug so that electrical short may not occur in the contact plug penetrating the image sensing device.

Figure 9:
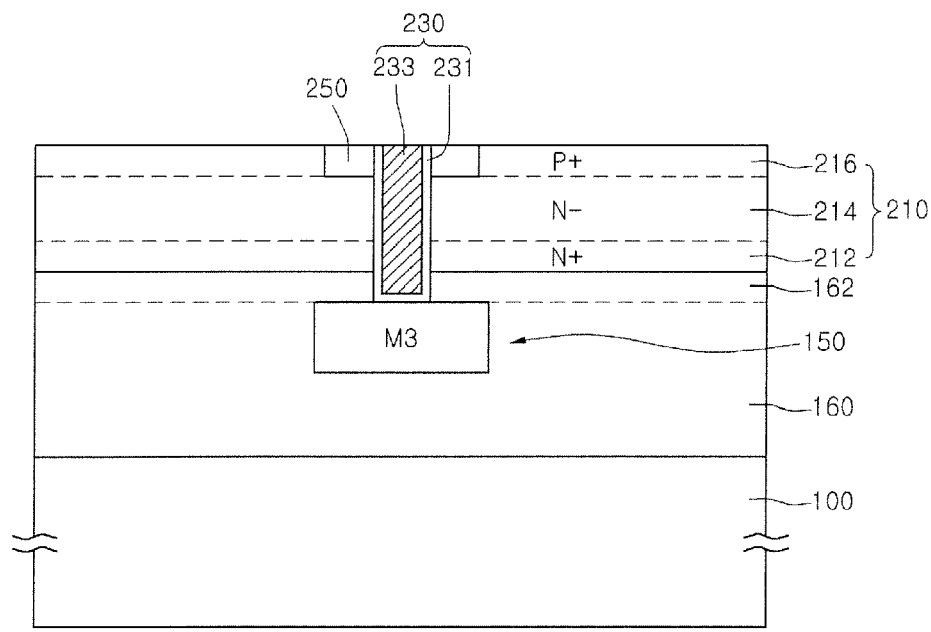

Next, referring to FIG. 9, a dielectric 250 such as an oxide layer and a nitride layer may be formed in the second trench T2 to more reliably inhibit short of the contact plug and the second conductive type layer 216.

Thereafter, a ground process may be performed on the second conductive type layer 216.

Figure 10:
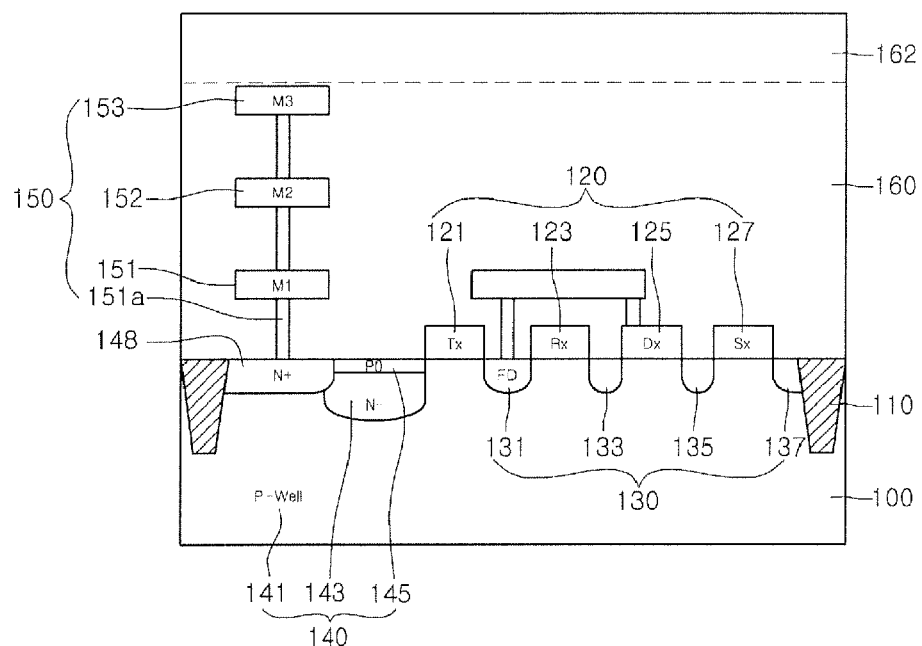
FIG. 10 is a cross-sectional view of an image sensor according to a second embodiment.

FIG. 10 is a cross-sectional view of an image sensor according to a second embodiment, and a detail view of a first substrate including an interconnection 150 formed therein.

The second embodiment may adopt the technical features of the first embodiment.

Unlike the first embodiment, a first conductive connection 148 is formed at one side of the electrical junction region 140.

An N+ connection region 148 may be formed at a P0/N−/P− junction 140 for an ohmic contact. In this case, a leakage source may be generated during the formation process of an N+ connection region 148 and a first metal contact 151a.

Also, when the N+ connection region 148 is formed over the surface of P0/N−/P− junction 140, an electric field may be additionally generated due to N+/P0 junction 148/145. This electric field may also become a leakage source.

Therefore, the second embodiment proposes a layout in which first contact plug 151a is formed in an active region not doped with a P0 layer but has an N+ connection region 148 that is electrically connected to N-junction 143.

According to the second embodiment, the electric field is not generated on and/or over a Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a readout circuitry at a first substrate;
   an interlayer dielectric on the first substrate;
   an interconnection in the interlayer dielectric, the interconnection being electrically connected to the readout circuitry;
   an image sensing device on the interconnection, the image sensing device comprising a first conductive type layer and a second conductive type layer; and
   a contact electrically connecting the first conductive type layer of the image sensing device and the interconnection, the contact passing through a first trench in the first conductive type layer and a second trench in the second conductive type layer;
   wherein a diameter of the second trench is larger than a diameter of the first trench, the second trench being formed by removing portions of the second conductive type layer of the image sensing device contacting the contact and exposing a portion of the first conductive type layer.

2. The image sensor according to claim 1, wherein the first trench exposes the interconnection.

3. The image sensor according to claim 2, wherein the contact comprises:
   a barrier metal layer formed on a surface of the first trench; and
   a contact plug on the barrier metal layer, the contact plug filling the first trench;
   wherein the second trench exposes a portion of the barrier metal layer through the second conductive type layer.

4. The image sensor according to claim 1, further comprising a dielectric in the second trench that is formed by the removing of the portions of the second conductive type layer of the image sensing device contacting the contact, wherein the dielectric is disposed on the portion of the first conductive type layer exposed by the second trench.

5. The image sensor according to claim 1, further comprising an electrical junction region electrically connected to the readout circuitry at the first substrate.

6. The image sensor according to claim 5, wherein the electrical junction region comprises:
   a first conductive type ion implantation region at the first substrate; and
   a second conductive type ion implantation region on the first conductive type ion implantation region.

7. The image sensor according to claim 5, wherein the readout circuitry comprises a transistor, wherein the electrical junction region is disposed at a source of the transistor, whereby a potential difference is provided between the source and a drain of the transistor.

8. The image sensor according to claim 5, further comprising a first conductive type connection between the electrical junction region and the interconnection to electrically connect the electrical junction region to the interconnection,
   wherein the first conductive type connection is disposed at an upper part of the electrical junction region.

9. The image sensor according to claim 5, further comprising a first conductive type connection between the electrical junction region and the interconnection to electrically connect the electrical junction region to the interconnection,
wherein the first conductive type connection is disposed at a side of the electrical junction region.

10. A method for manufacturing an image sensor, the method comprising:
forming a readout circuitry at a first substrate;
forming an interlayer dielectric on the first substrate, and forming an interconnection electrically connected to the readout circuitry in the interlayer dielectric;
forming an image sensing device comprising a first conductive type layer and a second conductive type layer on the interconnection;
forming a contact connecting the first conductive type layer of the image sensing device to the interconnection, wherein forming the contact comprises forming a first trench passing through the image sensing device and forming the contact filling the first trench; and
removing portions of the second conductive type layer around the contact to form a second trench exposing a portion of the first conductive type layer, a diameter of the second trench being larger than a diameter of the first trench.

11. The method according to claim 10, wherein the forming of the first trench passing through the image sensing device exposes the interconnection.

12. The method according to claim 11, wherein the forming of the contact filling the first trench comprises:
forming a barrier layer on a surface of the first trench; and
forming a contact plug on the barrier metal layer, the contact plug filling the first trench;
wherein the second trench exposes a portion of the barrier metal layer passing through the second conductive type layer.

13. The method according to claim 10, wherein the removing of the portions of the second conductive type layer comprises removing the second conductive type layer contacting the contact using etching selectivity with respect to the contact.

14. The method according to claim 10, further comprising forming a dielectric in a second trench that is formed by the removing of the portions of the second conductive type layer, wherein the dielectric is disposed on the portion of the first conductive type layer exposed by the second trench.

15. The method according to claim 10, further comprising forming an electrical junction region electrically connected to the readout circuitry at the first substrate.

16. The method according to claim 15, wherein the forming of the electrical junction region comprises:
forming a first conductive type ion implantation region at the first substrate; and
forming a second conductive type ion implantation region on the first conductive type ion implantation region.

17. The method according to claim 15, wherein the readout circuitry comprises a transistor, wherein the electrical junction region is disposed at a source of the transistor, whereby a potential difference is provided between the source and a drain of the transistor.

18. The method according to claim 15, further comprising forming a first conductive type connection between the electrical junction region and the interconnection to electrically connect the electrical junction region and the interconnection,
wherein the first conductive type connection is disposed at an upper part of the electrical junction region.

19. The method according to claim 15, further comprising forming a first conductive type connection between the electrical junction region and the interconnection to electrically connect the electrical junction region and the interconnection,
wherein the first conductive type connection is disposed at a side of the electrical junction region.

* * * * *